(12) United States Patent
Hao et al.

(10) Patent No.: US 6,403,483 B1
(45) Date of Patent: Jun. 11, 2002

(54) SHALLOW TRENCH ISOLATION HAVING AN ETCHING STOP LAYER AND METHOD FOR FABRICATING SAME

(75) Inventors: Chung-Peng Hao, Taipei; Chung-Lin Huang, Taichung; Chung-Yuan Lee, Taoyuan; Yih-Ren Shao, Hsien; Pei-Ing Lee, Taipei Hsien, all of (TW)

(73) Assignee: Nanya Technology Corp. (TW)

( * ) Notice: Subject to any disclaimer, the term of this patent is extended or adjusted under 35 U.S.C. 154(b) by 31 days.

(21) Appl. No.: 09/695,144

(22) Filed: Oct. 25, 2000

Related U.S. Application Data

(62) Division of application No. 09/089,241, filed on Jun. 2, 1998.

(30) Foreign Application Priority Data

Feb. 5, 1998 (TW) ........................................ 87101538 A

(51) Int. Cl.[7] ............................................ H01L 21/302
(52) U.S. Cl. .......................... 438/692; 438/723; 438/724
(58) Field of Search .................................. 438/691, 692, 438/694, 697, 706, 723, 724

(56) References Cited

U.S. PATENT DOCUMENTS

| | | | | |
|---|---|---|---|---|
| 5,929,504 A | * | 7/1999 | Mogami et al. | 257/510 |
| 5,943,590 A | * | 8/1999 | Wang et al. | 148/DIG. 50 |
| 6,197,691 B1 | * | 3/2001 | Lee | 438/691 |
| 6,225,225 B1 | * | 5/2001 | Goh et al. | 438/692 |
| 6,287,939 B1 | * | 9/2001 | Huang et al. | 438/423 |

* cited by examiner

Primary Examiner—Benjamin L. Utech
Assistant Examiner—Kin-Chan Chen
(74) Attorney, Agent, or Firm—Michael D. Bednarek; Shaw Pittman LLP

(57) ABSTRACT

A shallow trench isolation having an etching stop layer and its method of fabrication. The method utilizes a shield layer such as a silicon nitride layer to serve as an etching stop layer. The etching stop layer is formed in the top position of the shallow trench isolation.

12 Claims, 11 Drawing Sheets

SHALLOW TRENCH ISOLATION HAVING AN ETCHING STOP LAYER AND METHOD FOR FABRICATING SAME

This application is a division of Ser. No. 09/089,241 filed Jun. 2, 1998, pending.

BACKGROUND OF THE INVENTION

1. Field of the Invention

The present invention relates to a shallow trench isolation (STI) and its method of fabrication, and more particularly to a shallow trench isolation (STI) having an etching stop layer and its method of fabrication.

2. Description of the Prior Art

Referring to FIG. 1 through FIG. 9, the cross-sectional side views of a conventional method for fabricating a shallow trench are depicted in sequence.

Referring now to FIG. 1, a cross-sectional view of the starting step is schematically shown. In FIG. 1, the stacked structure 11, consisting of a silicon oxide layer 12, a polysilicon layer 14 and a silicon nitride layer 16, is formed on the surface of the substrate 10.

Next, as shown in FIG. 2, a resist layer 20 is formed on the surface of the silicon nitride layer 16 by photolithographic technique. Then, using the resist layer 20 as a mask, the stacked structure 11 and the substrate 10 are sequentially etched to form a shallow trench 22.

Now as shown in FIG. 3, the resist layer 20 is removed. Afterward, a thin oxide 30 is formed, by thermal oxidation, on the bottom and side walls of the shallow trench 22.

Referring now to FIG. 4, the silicon oxide layer 40 is formed over the substrate 100, so as to fill the shallow trench 22

Now as shown in FIG. 5, a portion of the silicon oxide layer 40 is removed, usually by chemical mechanical polishing (CMP) and then etching, to leave the silicon oxide layer 40a (e.g. Conventional isolation), within the shallow trench 22, whose upper surface is higher than the upper surface of the polysilicon layer 14.

Referring to FIG. 6, the silicon nitride layer 16 is removed. The polysilicon layer 60 and the silicide layer 62 are formed overlaying the substrate 10.

Next, referring to FIG. 7, the silicide 62, the polysilicon layer 60, and the polysilicon layer 14 are etched by using anisotropic etching to form polycide gates 71 and 73.

Then, as shown in FIG. 8, an oxide layer 81 is formed to serve as a passivation. Afterward, using photolithographic technique, the resist pattern 80 is formed to expose a portion surface of the oxide layer 81.

Next, referring to FIG. 9, using the resist pattern 80 as a mask, a portion of oxide layer 81 is etched, by conventional dry etching, to form a contact hole 85. Because of the occurrence of a misalignment, silicon oxide layer 40a (e.g. Conventional isolation) would be etched into a gap 86. A conductive material is filled in the contact hole 85 and the gap 86, thereby forming a conductive plug 91 and an interconnection 90.

As a result of the misalignment in the photolithographic process, the silicon oxide 40a will be etched into a gap within the substrate. Moreover, the conductive material in the gap will result in a substrate leakage.

SUMMARY OF THE INVENTION

In view of the above disadvantage, an object of the invention is to provide a method for fabricating a shallow trench isolation having an etching stop layer, thereby preventing the gap within the shallow trench isolation.

The above object is attained by providing a method for fabricating a shallow trench isolation having an etching stop layer, comprising the steps of: (a) providing a substrate; (b) forming a stacked structure consisting of a first insulated layer, a conductive layer, and a first shield layer in sequence, on said substrate; (c) defining said stacked structure and said substrate so as to form a shallow trench; (d) forming a second insulated layer over said substrate, to fill said shallow trench; (e) etching said second insulated layer so as to leave a portion of said second insulated layer remaining in said shallow trench, and to form a concave portion in the top position of said shallow trench; (f) removing said first shield layer; (g) forming a second shield layer over said substrate, to fill said concave portion; and (h) etching said second shield layer so as to leave a portion of said second shield layer in the concave portion, to serve as an etching stop layer.

Furthermore, the above object is attained by providing a method for fabricating a shallow trench isolation having an etching stop layer, comprising the steps of: (a) providing a silicon substrate; (b) forming a stacked structure consisting of a first silicon oxide layer, a polysilicon layer, and a first silicon nitride layer in sequence on said silicon substrate; (c) defining said stacked structure and said silicon substrate so as to form a shallow trench; (d) forming a second silicon oxide layer over said substrate, to fill said shallow trench using a high density plasma deposition; (e) polishing said second silicon oxide layer so as to leave a portion of said second silicon oxide layer remaining in said shallow trench, and to form a concave portion in the top position of said shallow trench, by chemical mechanical polishing; (f) removing said first silicon nitride layer; (g) forming a second silicon nitride layer over said silicon substrate, to fill said concave portion; and (h) polishing said second silicon nitride layer so as to leave a portion of said second silicon nitride layer in the concave portion, to serve as an etching stop layer.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIG. 10 through FIG. 21 of the drawings.

Figure 10:
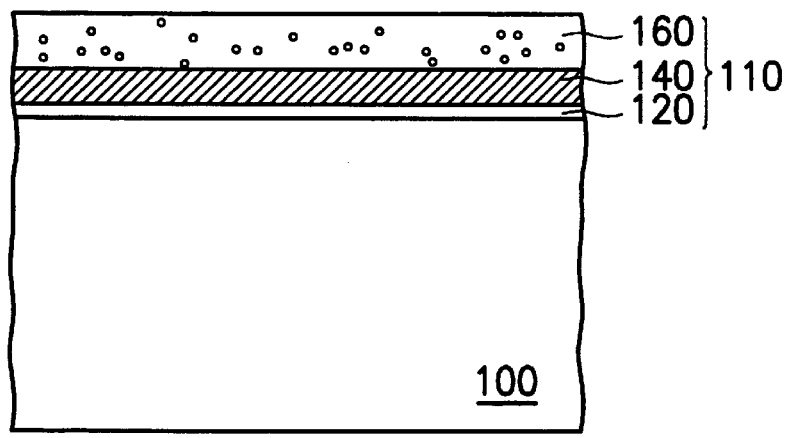
FIG. 10 through FIG. 20 are cross-sectional side views showing the manufacturing steps of a contact hole on the silicon substrate having a isolation structure according to the invention.

Referring now to FIG. 10, a cross-sectional view of the starting step is schematically shown. In FIG. 10, substrate 100 can be made of a semiconductor material such as silicon. The stacked structure 110, consisting of an insulated layer 120, a conductive layer 140 and a shield layer 160, is formed on the surface of the substrate 100.

The insulated layer 120 can be a silicon oxide layer having a thickness in the range of approximately 40 to 120 angstroms, serving as a gate oxide, and is grown by thermal oxidation. Preferably, the conductive layer 140, such as a polysilicon layer having a thickness in the range of approximately 1000 to 2500 angstroms, is deposited by low-pressure chemical vapor deposition (LPCVD) using SiH4 as the primary reactive gas. The shield layer 160, such as a silicon nitride, has a thickness in the range of approximately 2000 to 4000 angstroms.

Figure 11:
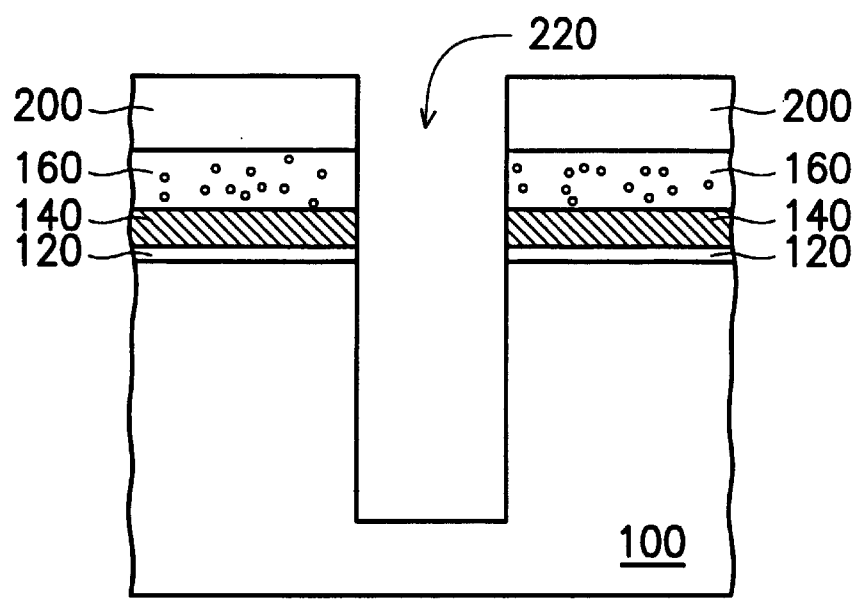

Next, as shown in FIG. 11, a resist pattern 200 is formed on the surface of the shield layer 160 by photolithographic technique. Then, using the resist pattern 200 as a mask, the stacked structure 110 and the substrate 100 are sequentially etched to form a shallow trench 220 by anisotropic reactive ion etching (RIE), which uses $CHF_3$ as the etching reactive gas. The depth of the shallow trench 220, within the substrate 100, is in the range of 0.3 $\mu$m to 0.4 $\mu$m.

Figure 12:
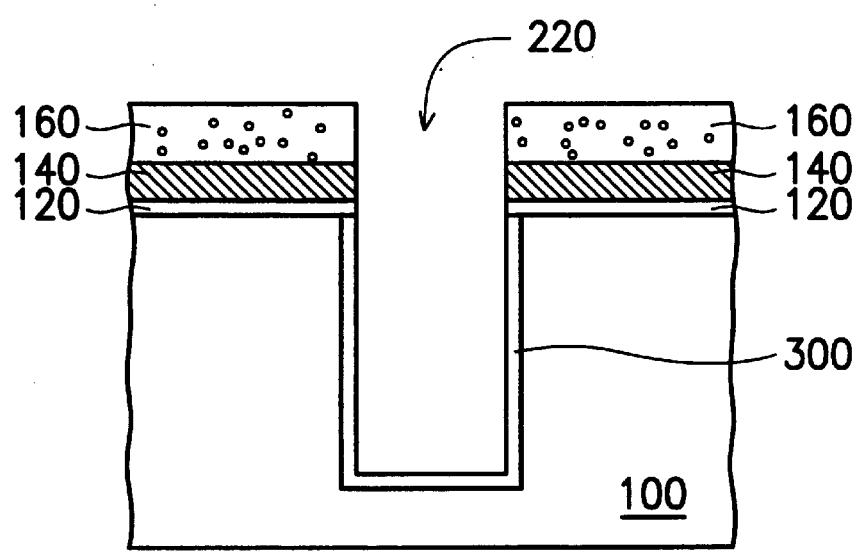

Now as shown in FIG. 12, the resist pattern 200 is removed. Afterward, a thin oxide 300 is formed, preferably by thermal oxidation, on the bottom and side walls of the shallow trench 220.

Figure 13:
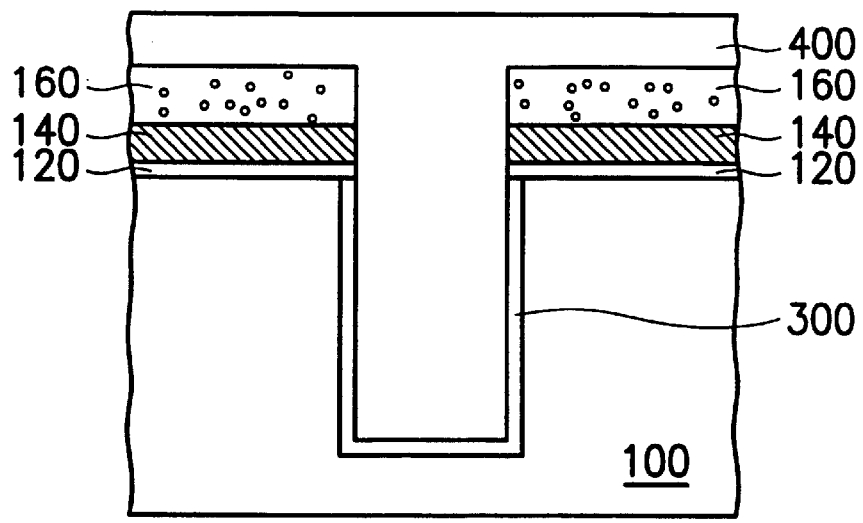

Referring now to FIG. 13, the insulated layer 400, such as silicon oxide, is formed over the substrate 100, so as to fill the shallow trench 220. The insulated layer 400 is deposited, for example, by high density plasma (HDP) such as inductive coupled plasma (ICP) or electron cyclotron resonance (ECR).

Figure 14:
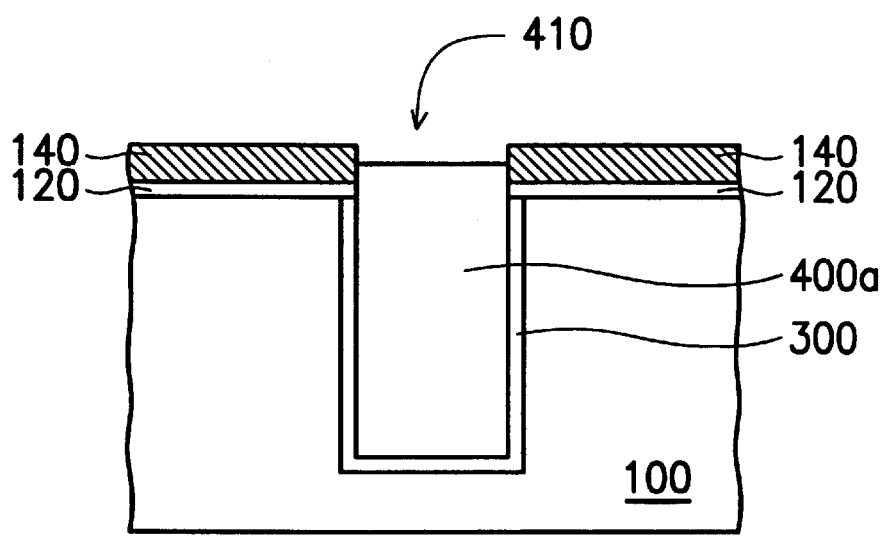

Now as shown in FIG. 14, a portion of the insulated layer 400 is removed, usually by etching back or chemical mechanical polishing (CMP) and then etching, to leave the insulated layer 400a within the shallow trench, whose upper surface is lower than the upper surface of the conductive layer 140, and to form a concave portion 410. Subsequently, the shield layer 160 is removed.

Figure 15:
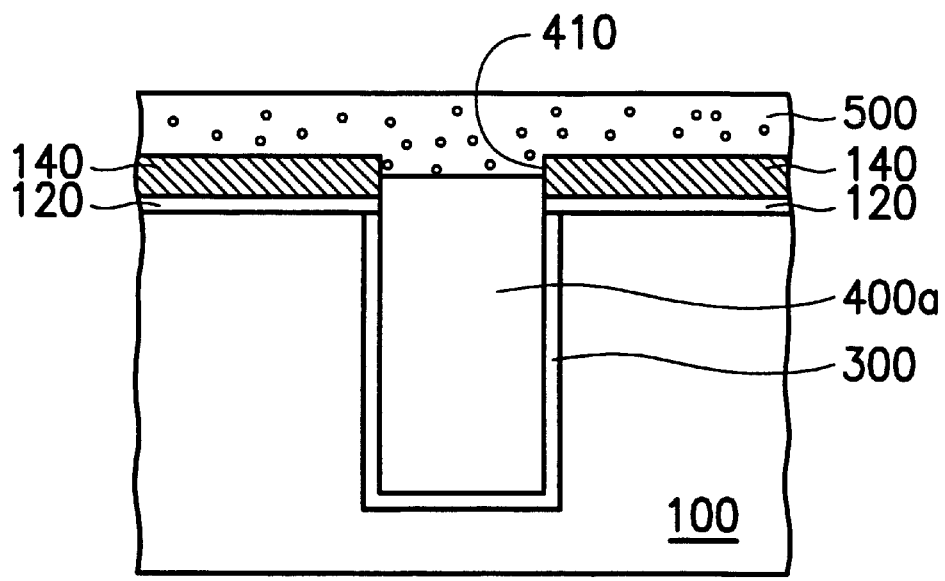

Referring to FIG. 15, the shield layer 500, such as silicon nitride, is formed, usually by chemical vapor deposition (CVD), overlaying the substrate 100 to fill the concave portion 410.

Figure 16:
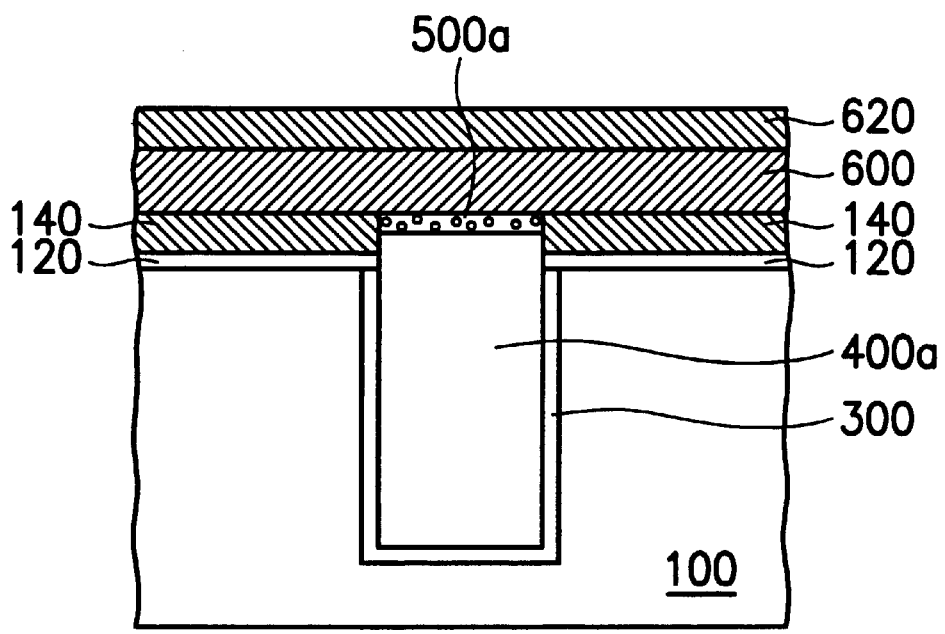

Next, referring to FIG. 16, an etching or CMP is used to remove a portion of shield layer 500 to carry out the shallow trench isolation, which includes the shield layer 500a within the concave portion 410 and an insulated layer 400a. The shield layer 500a is used as an etching stop layer. Afterward, the doped polysilicon layer 600 and the silicide layer 620 are formed overlaying the substrate 100.

Figure 17:
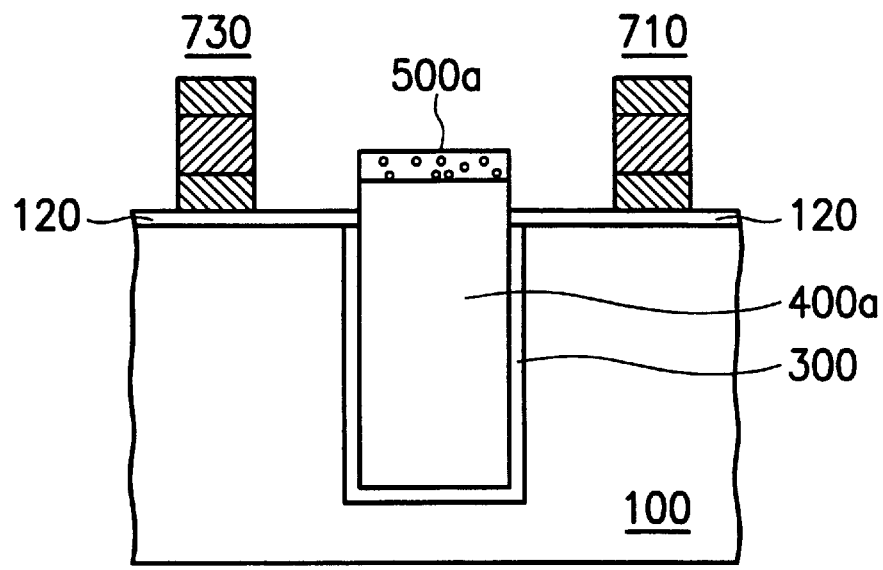

Then, as shown in FIG. 17, by utilizing photolithographic technique and anisotropic etching, the doped polysilicon layer 600, the silicide layer 620, and the conductive layer 140 are etched to form the polycide gates 710 and 730.

Figure 18:
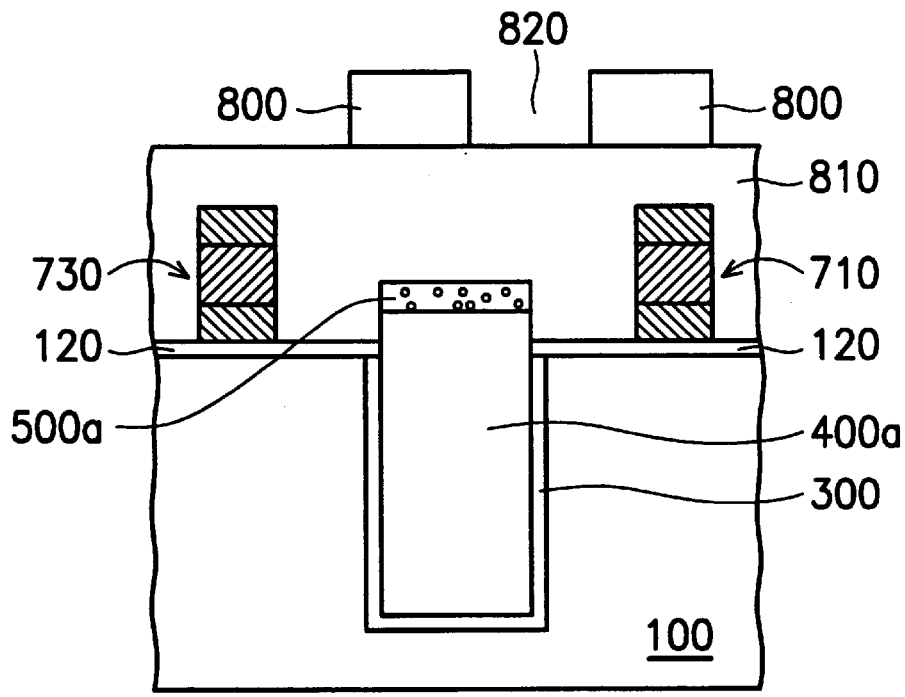

As shown in FIG. 18, the oxide layer 810, used as a passivation, is formed by plasma-enhanced chemical vapor deposition (PECVD), which uses tetraethyl-ortho-silicate (TEOS) as the reactive gas.

Afterward, using photolithographic technique, the resist pattern 800 is formed to expose the surface of a portion of oxide layer 810. The resist pattern 800 is disposed overlaying the oxide layer 810 in a misalignment position.

Figure 19:
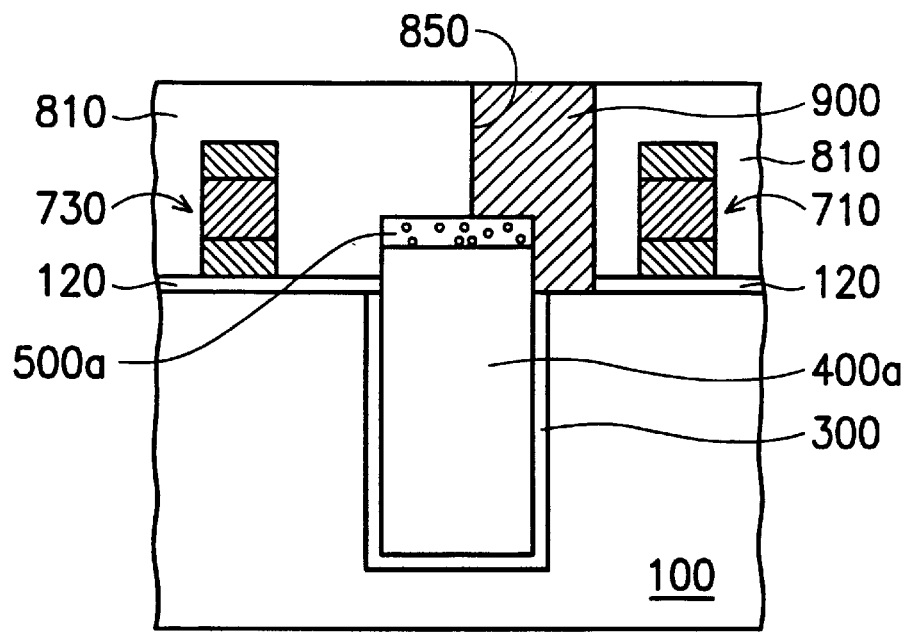

Next, referring to FIG. 19, using the resist pattern 800 as a mask, a portion of oxide layer 810 is etched, by conventional dry etching, to form a contact hole 850 until the surface of the substrate 100 is exposed. The conductive plug 900 is then formed by filling in conductive material.

Figure 20:
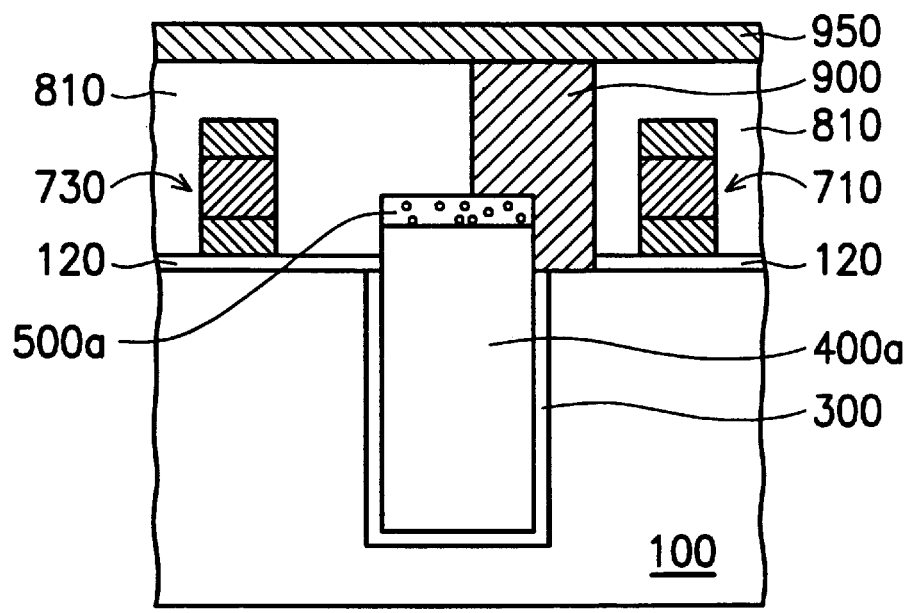

As shown in FIG. 20, the metal interconnect 950, such as W, AlSi, AlSiCu, or AlCu, is formed on the substrate 100, for connecting two devices.

Figure 21:
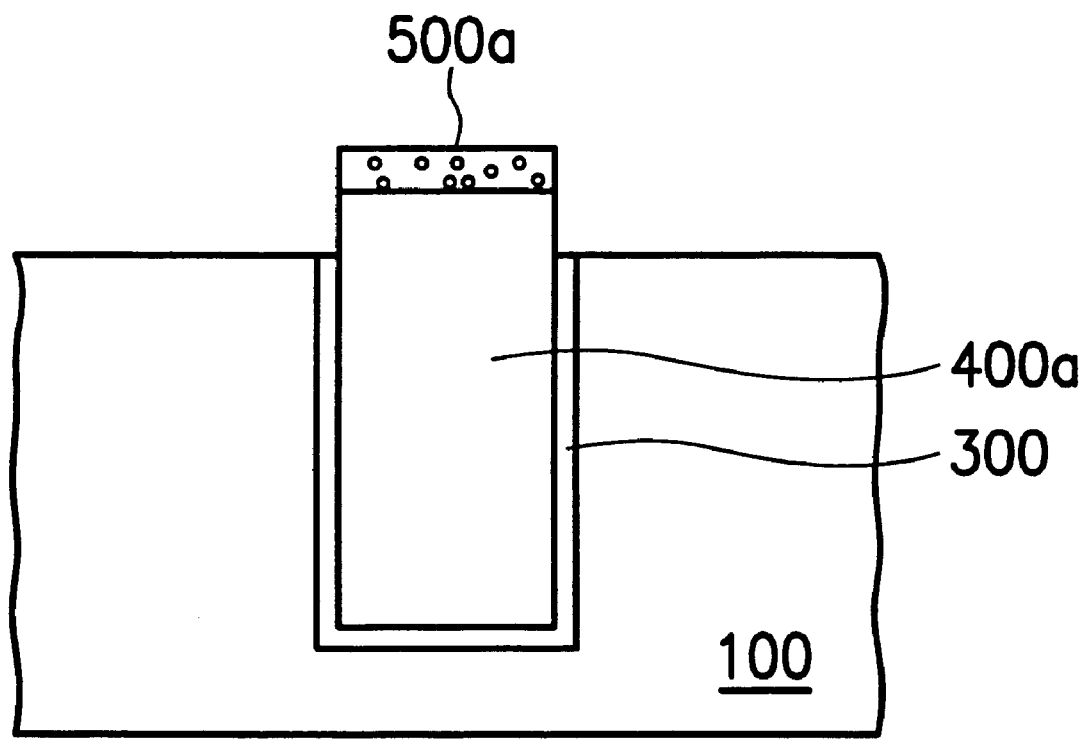
FIG. 21 is a cross-sectional view showing a shallow trench isolation structure having an etching stop layer of the preferred embodiment of the invention.

Finally, FIG. 21 depicts a cross-sectional view of a shallow trench isolation structure having an etching stop layer of the preferred embodiment of the invention. The shallow trench isolation includes a substrate 100 in which is formed a shallow trench 220 in the predetermined position, a isolation structure filling in the shallow trench 220, wherein the isolation structure consists of an insulated layer 400a and an etching stop layer 500a. Preferably, the thin oxide layer 300 is formed on the side walls and bottom of the shallow trench 220.

Figure 1:
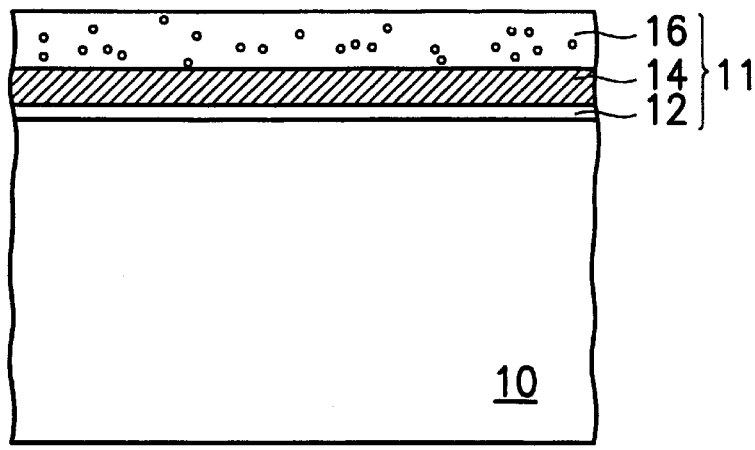
FIG. 1 through FIG. 9 are cross-sectional side views showing the manufacturing steps of a contact hole on the silicon substrate having a conventional isolation structure.
Figure 2:
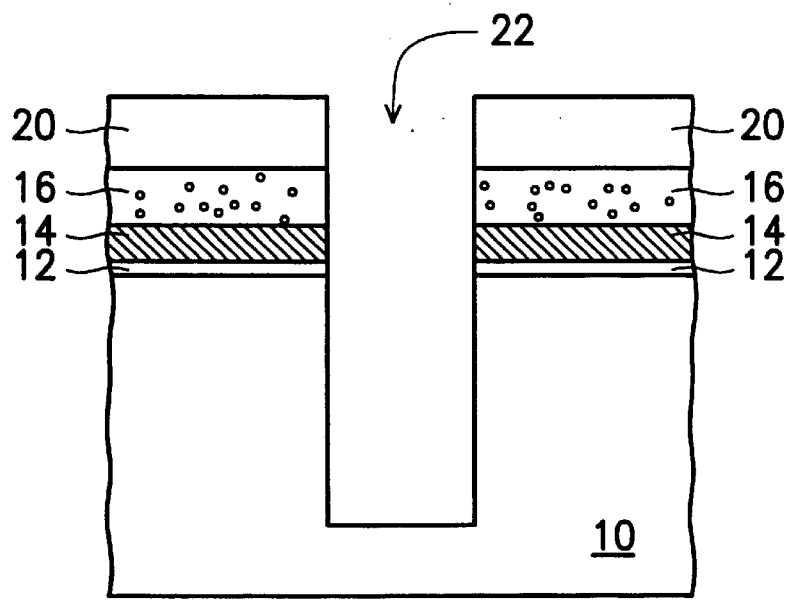
Figure 3:
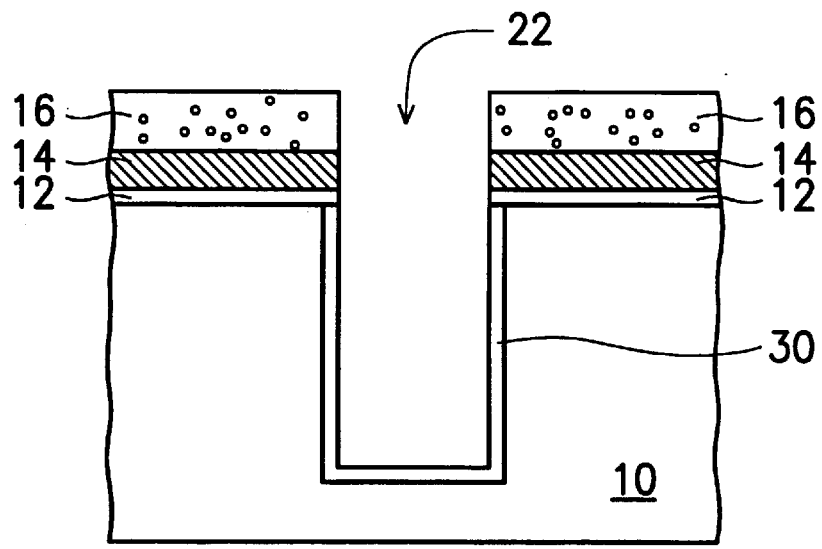
Figure 4:
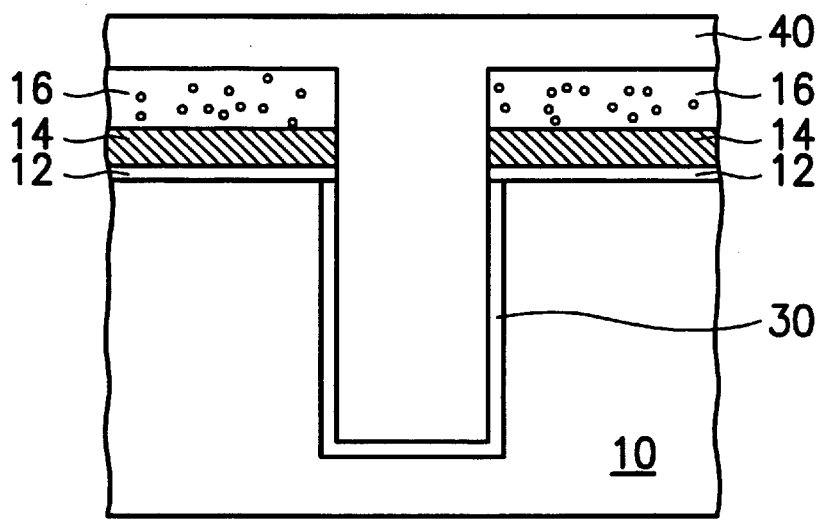
Figure 5:
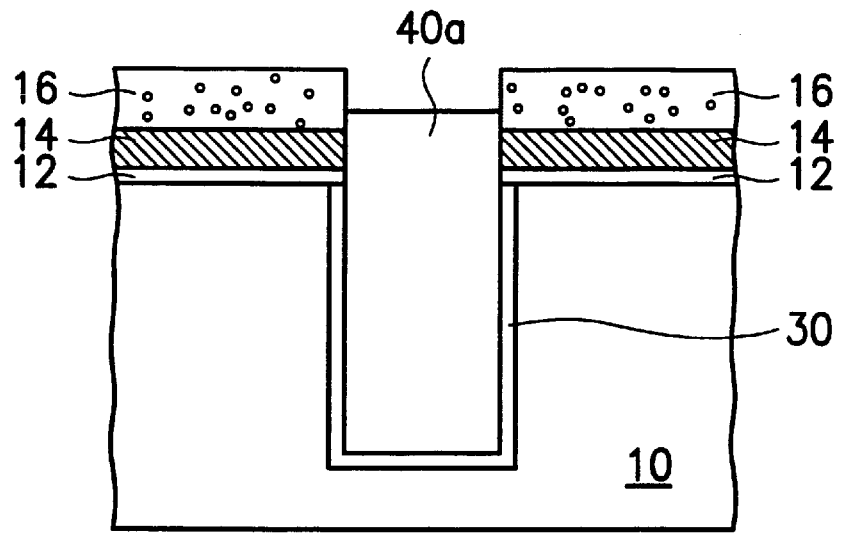
Figure 6:
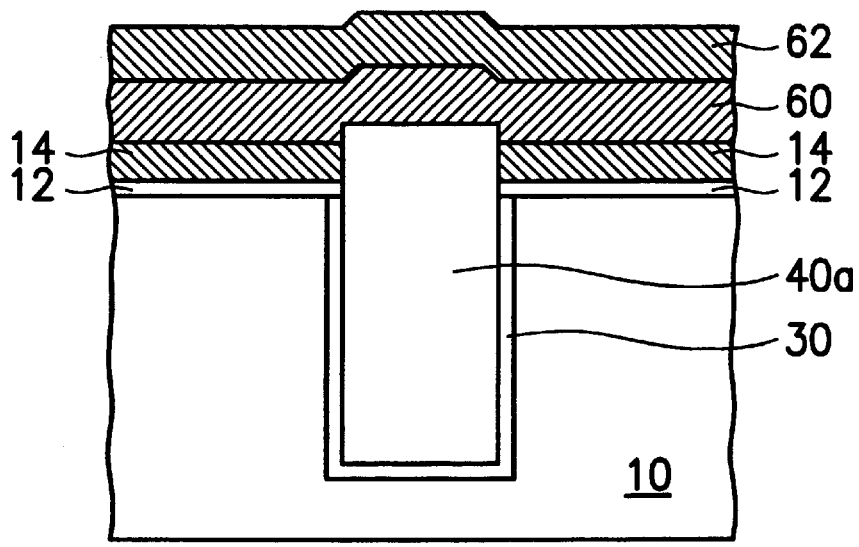
Figure 7:
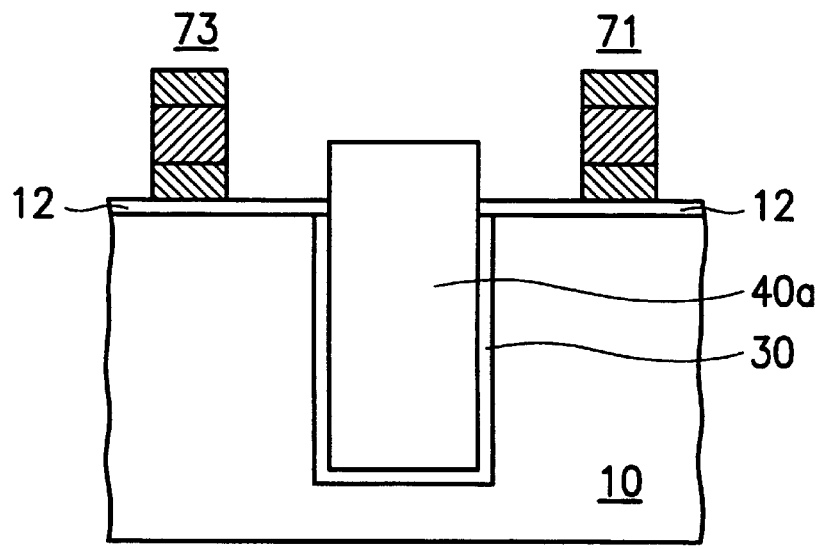
Figure 8:
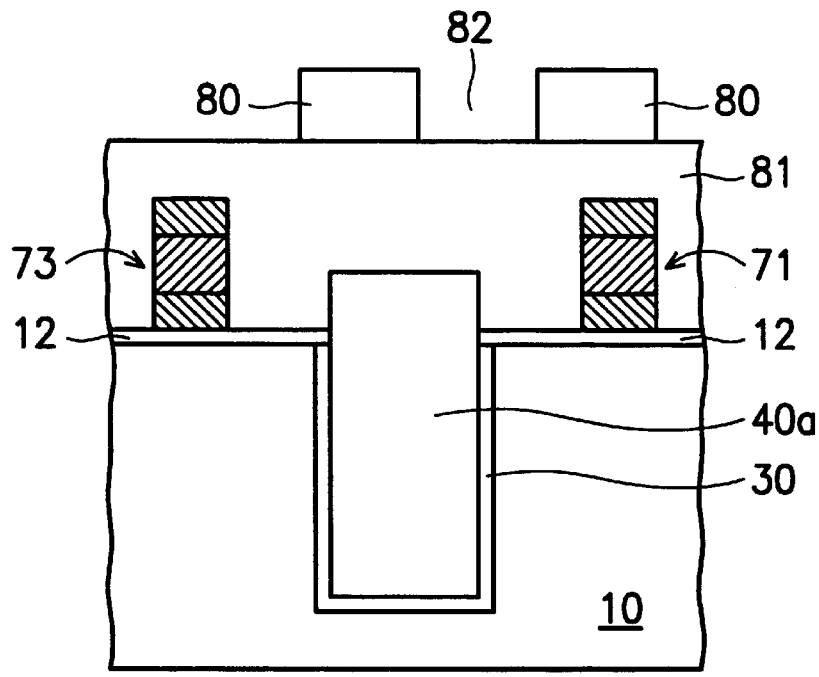
Figure 9:
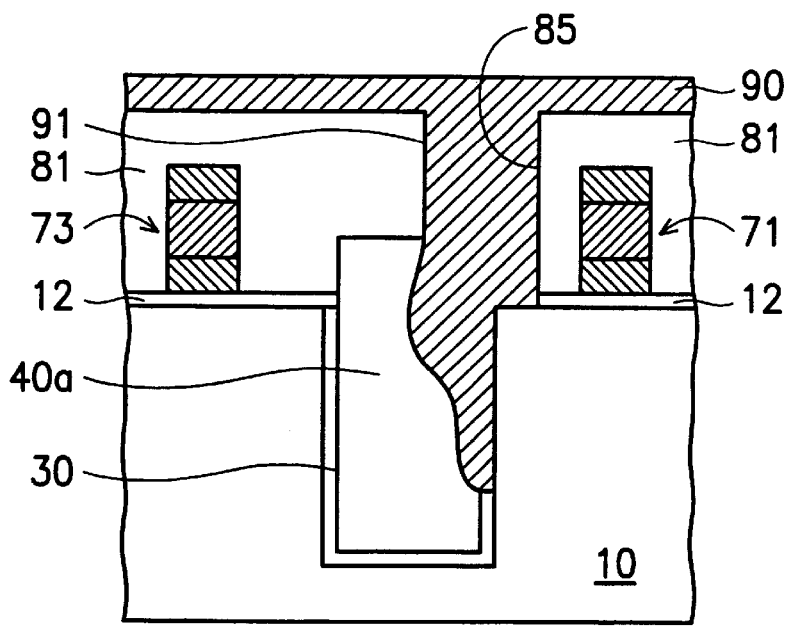

Due to the existence of shield layer 500a (e.g. etching stop layer), a gap as depicted in FIG. 9 will not be produced, thereby preventing substrate leakage.

What is claimed is:

1. A method for fabricating a shallow trench isolation having an etching stop layer, comprising the steps of:
   (a) providing a substrate;
   (b) forming a stacked structure consisting of a first insulated layer, a conductive layer, and a first shield layer in sequence on said substrate;
   (c) defining said stacked structure and said substrate so as to form a shallow trench;
   (d) forming a second insulated layer over said substrate, to fill said shallow trench;
   (e) etching said second insulated layer so as to leave a portion of said second insulated layer remaining in said shallow trench, and to form a concave portion in the top position of said shallow trench;
   (f) removing said first shield layer;
   (g) forming a second shield layer over said substrate, to fill said concave portion; and
   (h) etching said second shield layer so as to leave a portion of said second shield layer in the concave portion, to serve as an etching stop layer.

2. A method as claimed in claim 1, wherein said substrate is a silicon substrate.

3. A method as claimed in claim 1, wherein said first insulated layer is a silicon oxide layer.

4. A method as claimed in claim 1, wherein said conductive layer is a polysilicon layer.

5. A method as claimed in claim 1, wherein said shield layer is a silicon nitride layer.

6. A method as claimed in claim 1, wherein said second insulated layer is a silicon oxide layer.

7. A method as claimed in claim 1, wherein said etching stop layer in the step (h) is a silicon nitride layer.

8. A method as claimed in claim 1, wherein said first and second shield layers are silicon nitride layers deposited by low pressure chemical vapor deposition which uses $SiH_2Cl_2$ and $NH_3$ as a reaction gas.

9. A method as claimed in claim 1, wherein said concave portion in step (e) is formed by an etching back method.

10. A method as claimed in claim 1, wherein said concave portion in step (e) is formed by the sequential steps of chemical mechanical polishing and dry etching.

11. A method as claimed in claim 1, wherein said etching stop layer in step (h) is attained by removing a portion of said second shield layer using chemical mechanical polishing.

12. A method for fabricating a shallow trench isolation having an etching stop layer, comprising the steps of:
   (a) providing a silicon substrate;
   (b) forming a stacked structure consisting of a first silicon oxide layer, a polysilicon layer, and a first silicon nitride layer in sequence on said silicon substrate;
   (c) defining said stacked structure and said silicon substrate so as to form a shallow trench;

(d) forming a second silicon oxide layer over said substrate, to fill said shallow trench using a high density plasma deposition;

(e) polishing said second silicon oxide layer so as to leave a portion of said second silicon oxide layer remaining in said shallow trench, and to form a concave portion in the top position of said shallow trench, by chemical mechanical polishing;

(f) removing said first silicon nitride layer;

(g) forming a second silicon nitride layer over said silicon substrate, to fill said concave portion; and (h) polishing said second silicon nitride layer so as to leave a portion of said second silicon nitride layer in the concave portion, to serve as an etching stop layer.

* * * * *